(12) United States Patent  
Isobe

(10) Patent No.: US 6,927,705 B2  
(45) Date of Patent: Aug. 9, 2005

(54) MAGNETIC RUBBER ENCODER

(75) Inventor: Hiroshi Isobe, Iwata (JP)

(73) Assignee: NTN Corporation, Osaka (JP)

( * ) Notice: Subject to any disclaimer, the term of this patent is extended or adjusted under 35 U.S.C. 154(b) by 0 days.

(21) Appl. No.: 10/835,006

(22) Filed: Apr. 30, 2004

(65) Prior Publication Data

US 2004/0227648 A1 Nov. 18, 2004

(30) Foreign Application Priority Data

May 16, 2003 (JP) ........................................ 2003-138214

(51) Int. Cl.$^7$ ............................................. H03M 1/22
(52) U.S. Cl. ........................................ 341/13; 384/448
(58) Field of Search ........................... 341/13; 310/268; 384/448

(56) References Cited

U.S. PATENT DOCUMENTS 3,568,182 A * 3/1971 Jones ........................... 341/13
4,334,166 A * 6/1982 Miyahara et al. ........... 310/268
5,967,669 A * 10/1999 Ouchi ......................... 384/448
6,789,948 B2 * 9/2004 Nakajima .................... 384/448

OTHER PUBLICATIONS

Michael C. Brauer et al., Patent Abstracts of Japan, "High–Resolution Coder", Publication No.: 03–130615, Publication Date: (Jun. 4, 1991).

* cited by examiner

*Primary Examiner*—Jean Bruner Jeanglaude

(57) ABSTRACT

A magnetic rubber encoder employing a rubber magnet, of a kind which, within a predetermined range of polarization pitches, the maximum magnetization intensity for the selected polarization pitch can be obtained, is provided. The magnetic rubber encoder 1 includes an annular magnetic member 2 made of a rubber material containing a magnet material and having a plurality of opposite magnetic poles N and S alternating with each other in a direction circumferentially thereof. The relationship between the polarization pitch p of each magnetic pole and the thickness w of the magnetic member 2 is expressed by $0.4\ p \leq w \leq 1.0\ p$. The polarization pitch p is chosen to be within the range of, for example, 0.5 to 1.5 mm.

5 Claims, 3 Drawing Sheets

MAGNETIC RUBBER ENCODER

BACKGROUND OF THE INVENTION

1. Field of the Invention

The present invention relates to a magnetic rubber encoder for use in detecting the number of revolution of a rotating element.

2. Description of the Prior Art

Certain magnetic rubber encoders for detecting the number of revolution of a rotating element or the like includes a rubber magnet assembly which has a rubber magnet rigidly secured to an annular core metal and having a plurality of opposite magnetic poles magnetized thereto so as to alternate with each other in a direction circumferentially of the core metal. When in use, the magnetic rubber encoder cooperates with a magnetic sensor, disposed in face-to-face relation therewith, so that as the magnetic rubber encoder rotates together with a rotating element, the magnetic sensor can detect passage of the opposite magnetic poles and then provide an electric output indicative of the number of revolutions of the rotating element in terms of the frequency of the opposite magnetic poles having traversed in front of the magnetic sensor.

In order to enhance the resolution of the magnetic rubber encoder, the polarization pitch on a magnetic member made of a rubber magnet, that is, the polarization pitch of each of the alternating magnetic poles must be reduced as small as possible. FIG. 2 illustrates the relationship between the polarization pitch p and the magnetization intensity b, and it is clear that if the polarization pitch p decreases in order to enhance the resolution, the magnetization intensity b decreases correspondingly.

The Japanese Laid-open Patent Publication No. 3-130815 discloses determination of the optimum thickness of a magnetized rubber to obtain the maximum magnetization intensity $b_{max}$, by optimizing the ratio between the thickness w of the magnetized rubber and the polarization pitch p when the latter is within the range of about 0.25 mm to 2.5 mm. According to this patent publication, the optimum thickness w of the magnetized rubber is calculated about 1.25 p. with the ratio between the thickness w and the polarization pitch p chosen to be within the range of 1.25±25%.

However, when extensive studies were conducted, in which the polarization pitch p and the magnetized rubber thickness w were changed, it has been found that no maximum magnetization intensity $b_{max}$ could be obtained when the thickness w of the magnetized rubber encoder was about 1.25 times the polarization pitch p, with the polarization pitch p within the range of about 0.5 mm to 1.5 mm.

SUMMARY OF THE INVENTION

Accordingly, the present invention is intended to provide a magnetic rubber encoder employing a rubber magnet, of a kind which, within a predetermined range of polarization pitches, the maximum magnetization intensity for the selected polarization pitch can be obtained.

In order to accomplish the foregoing object, the present invention provides a magnetic rubber encoder which includes an annular magnetic member made of a rubber material, containing a magnet material, and having a plurality of opposite magnetic poles alternating with each other in a direction circumferentially thereof. The opposite magnetic poles are laid at intervals of a polarization pitch p, indicative of the pitch between the neighboring magnetic poles, and the magnetic member has a thickness w which has a relationship with the polarization pitch p as expressed by the following formula:

$$0.4\, p \leq w \leq 1.0\, p \tag{1}$$

It is to be noted that the magnetic rubber encoder of the present invention may be either a radial type or an axial type. The thickness w of the magnetic member is as measured in a direction conforming to a detecting direction and, therefore, in the case of the radial type, the thickness w is measured in a direction radially of the magnetic rubber encoder while in the case of the axial type, the thickness w is measured in a direction axially of the magnetic rubber encoder.

According to results of experiments conducted, it has been found that, where the polarization pitch p is within a predetermined range, selection of (0.4 p≦w≦1.0 p) for the relationship between the polarization pitch p and the thickness w as measured in the radial direction is effective to secure the maximum magnetization intensity $b_{max}$ for the particular polarization pitches. In order to enhance the resolution of the magnetic rubber encoder, the maximum magnetization intensity can be obtained if the thickness of the magnetic member in the form of a rubber magnet is so selected and designed as to satisfy 0.4 p≦w≦1.0 p.

The predetermined range of the polarization pitch taken in the experiments is from 0.5 to 1.5 mm. This range of the polarization pitch allows the relationship between the polarization pitch p and the thickness w of the magnetic member to satisfy the foregoing formula (1).

The magnet material of the magnetic member may be an anisotropic ferrite material. The ferrite material is inexpensive and has an excellent characteristic as a magnet material. Of the various ferrite materials, the anisotropic ferrite material has a highly oriented easy magnetization axis. Because of this, the use of the anisotropic ferrite material allows the magnet material to be highly oriented, securing enhancement of the maximum magnetization intensity $b_{max}$ of the magnetic member. In addition, the ferrite material can be produced inexpensively.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF THE EMBODIMENTS

Figure 1A:
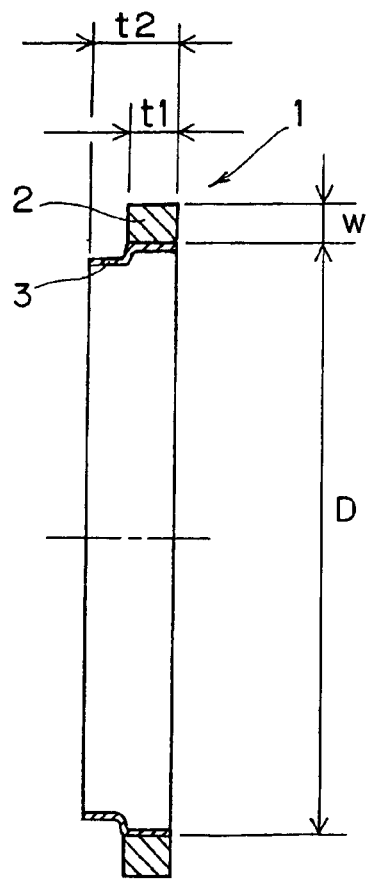
FIG. 1A is a side sectional view of a magnetic rubber encoder according to a preferred embodiment of the present invention.
Figure 1B:
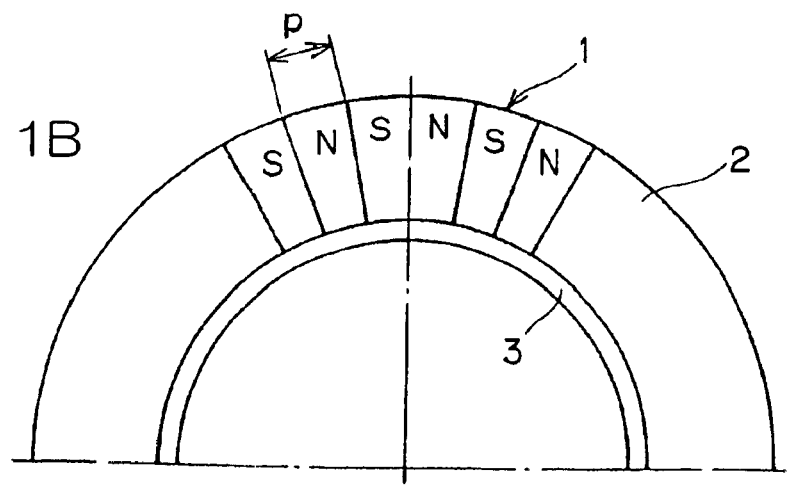
FIG. 1B is a fragmentary front elevational view, on an enlarged scale, of the magnetic rubber encoder shown in FIG. 1A.
Figure 2:
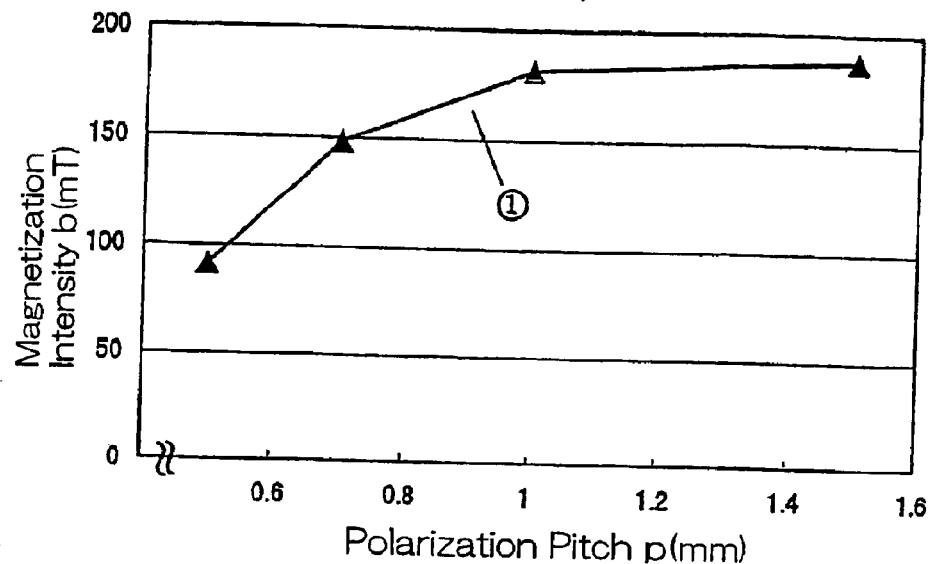
FIG. 2 is a graph showing the relationship between the polarization pitch p and the magnetization intensity b.

A preferred embodiment of the present invention will now be described with reference to the accompanying drawings. Referring to FIGS. 1 and 2, a magnetic rubber encoder 1 includes an annular magnetic member 2 made of a rubber material containing a magnet material. The annular magnetic member 2 has a plurality of opposite magnetic poles N and S magnetized thereto so as to alternate with each other in a direction circumferentially thereof. The alternating magnetic poles N and S are spaced uniformly at intervals of a predetermined polarization pitch p. This magnetic member 2 is fixedly mounted on and bonded by, for example, vulcanization to an outer periphery of an annular core metal 3. The magnet material is a magnetic powder of, for example, anisotropic ferrite material, and the magnetic member 2 is prepared in the form of a rubber magnet by mixing the magnetic powder with the rubber material, shaping the resultant mixture, vulcanizing the shaped mixture and finally magnetizing the vulcanized mixture. For the magnetic powder, any other suitable material than the anisotropic ferrite material can be employed.

The magnetic rubber encoder 1 is featured in that the polarization pitch p and the thickness w of the magnetic member 2 have the following relation with each other:

$$0.4\,p \leq w \leq 1.0\,p$$

It is, however, to be noted that if the magnetic member 2 is of a radial type, the polarization pitch p is of a value equal to the circumference of the magnetic member 2 divided by the number of the poles.

When in use, a magnetic sensor (not shown) such as a Hall element is disposed in face-to-face relation with an outer peripheral surface or annular side surface of the magnetic member 2 so that as the magnetic rubber encoder 1 rotates together with a rotating element, the magnetic sensor can detect passage of the opposite magnetic poles N and S and then provide an electric output indicative of the number of revolutions of the rotating element in terms of the frequency of the opposite magnetic poles having traversed in front of the magnetic sensor.

The magnetic rubber encoder 1 may be of either a radial type or an axial type. In the case of the radial type, the magnetic sensor is disposed in face-to-face relation with the outer peripheral surface of the magnetic member 2, whereas in the case of the axial type, the magnetic sensor is disposed in face-to-face relation with the annular side surface of the magnetic member 2.

Accordingly, in the case of the radial type, it is preferred that the magnetic member 2 has such a longitudinal sectional shape and such a manner of magnetization that a large amount of magnetic fluxes generated by the magnetic member 2 can be obtained in the radial direction. On the other hand, in the case of the axial type, it is preferred that the magnetic member 2 has such a longitudinal sectional shape and such a manner of magnetization that a large amount of magnetic fluxes generated by the magnetic member 2 can be obtained in the axial direction.

The magnetic member 2 has a thickness w, which is measured in a direction conforming to the direction in which magnetic fluxes are detected, that is, in a direction radially thereof in the case of the radial type or in a direction axially thereof in the case of the axial type. FIGS. 1A and 1B illustrate the magnetic member 2 for use in the magnetic rubber encoder 1 of the radial type.

The magnetic rubber encoder 1 of the radial type as shown in FIGS. 1A and 1B was tested. The component parts of the magnetic rubber encoder 1 tested were so sized as follows. The magnetic member 2 was 44 mm in an inner diameter D and 3.6 mm in an axial width t1, and the core metal 3 was 6.4 mm in an axial width t2. The magnetic member 2 was produced in the manner described above in the form of an anisotropic rubber magnet made of a ferrite material. Magnetization of the rubber magnet was carried out under the condition as set forth in Table 1 below.

Figure 4A:
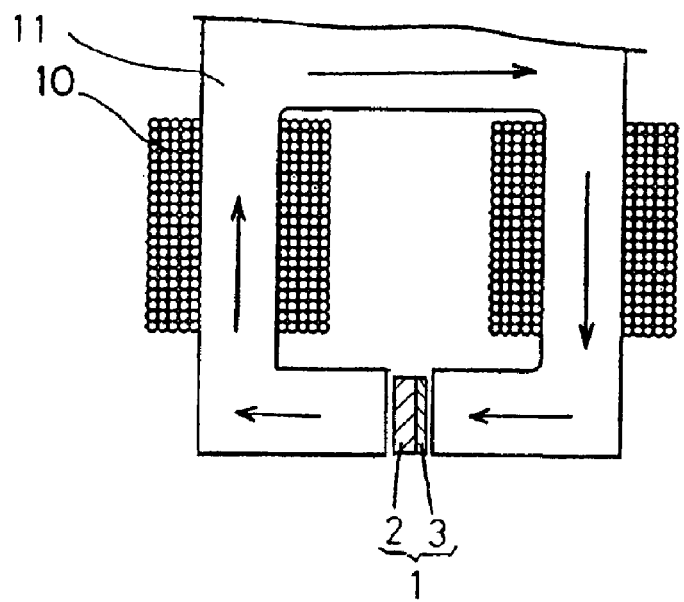
FIG. 4A is a schematic diagram showing a polarizing apparatus.
Figure 4B:
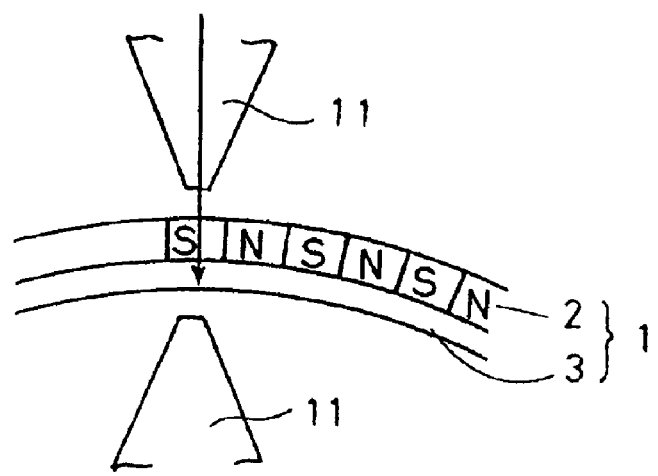
FIG. 4B is a schematic fragmentary elevational view of the apparatus, showing the manner of a rubber material being polarized to provide a rubber magnet.

Specifically, the magnetization was carried out by the use of a polarizing apparatus of a structure in which a magnetizing coil 10 is wound around a yoke 11 as shown in FIG. 4, and was based on a feed-through index magnetization in which the opposite magnetic poles N and S of the magnetic rubber encoder 1 were individually successively polarized one at a time in a direction circumferentially thereof. The magnetic sensor used was a Hall sensor providing an analog output and was disposed in face-to-face relation with the outer peripheral surface of the magnetic member 2.

TABLE 1

| Thickness w | Polarization Pitch p (mm) | | | | |
| --- | --- | --- | --- | --- | --- |
| (mm) | 0.3 | 0.5 | 0.7 | 1.0 | 1.5 |
| 0.4 | 235 | 141 | 101 | 70 | 46 |
| 0.6 | 237 | 142 | 101 | 71 | 46 |
| 1.0 | 241 | 145 | 103 | 72 | 48 |
| 1.5 | 246 | 148 | 105 | 74 | 49 |
| 3.0 | 262 | 157 | 112 | 79 | 52 |

Figure 3:
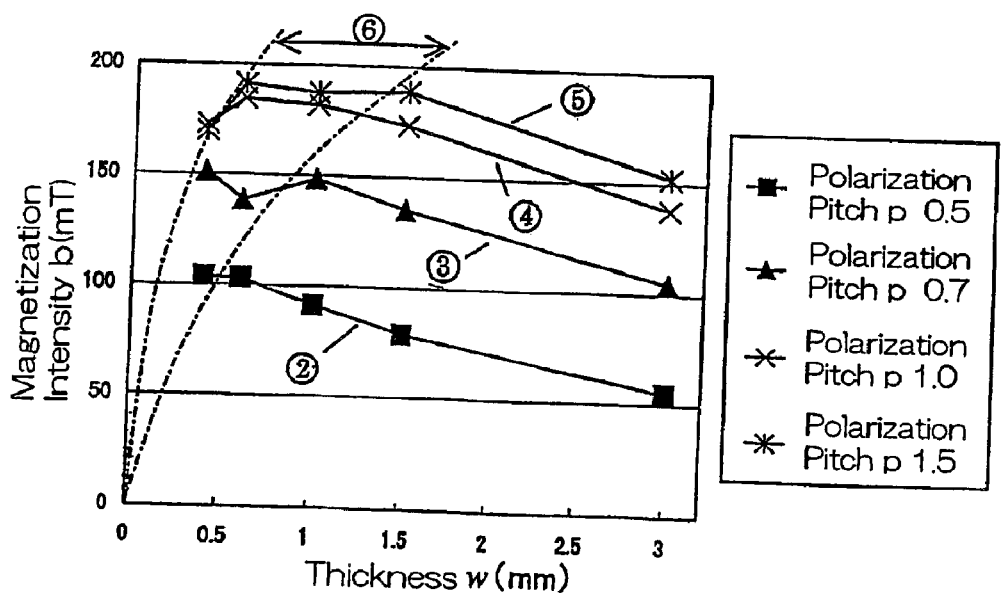
FIG. 3 is a graph showing the relationship between the thickness w and the magnetization intensity b when various polarization pitches are chosen.

FIG. 3 illustrates a graph showing the relationship between the radial thickness w and the magnetization intensity b of the magnetic member 2 when the polarization pitch p was chosen to be 0.5 mm (shown by a curve ②), 0.7 mm (shown by a curve ③), 1.0 mm (shown by a curve ④), and 1.5 mm (shown by a curve ⑤) for each of the tests conducted. It will readily be seen that as the polarization pitch p is reduced (with the curve ⑤ shifting towards the curve ②), the peak position of the magnetization intensity b for each curve shifts leftwards as viewed in FIG. 3.

It will also readily be seen that each of the curves ② to ⑤ attains the peak value when the thickness w is within the range shown by ⑥ in the graph of FIG. 3. The thickness w of the magnetized rubber if it is within the range ⑥ represents the optimum thickness w of the magnetized rubber and, thus, within the range ⑥ the relationship between the polarization pitch p and the thickness w of the magnetized rubber assumes the formula: $0.4\,p \leq w \leq 1.0\,p$. In other words, if the thickness w of the magnetized rubber is chosen within the range of 0.4 times the polarization pitch p to 1.0 times the polarization pitch p, the maximum magnetization intensity $b_{max}$ at that chosen polarization pitch p can be obtained.

As can readily be understood from the results of the experiments discussed above, the magnetic rubber encoder 1 can provide the following advantages.

(1) If the thickness w of the magnetized rubber is selected within the range of 0.4 times the polarization pitch p to 1.0 times the polarization pitch p, the maximum magnetization intensity $b_{max}$ at that chosen polarization pitch p can be obtained.

(2) Where the resolution of the magnetic rubber encoder 1 is desired to be enhanced, reduction of the polarization pitch p results in decrease of the magnetization intensity b, but if the thickness w of the magnetized rubber is so selected and designed as to satisfy the relationship with the polarization pitch p as represented by the foregoing formula, it is possible to secure the maximum magnetization intensity.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. By way of example, the magnetic rubber encoder 1 of the present invention can be equally applied to, for example, a wheel support bearing assembly or any other rolling bearing assembly.

Also, although in describing the preferred embodiment of the present invention, the magnetic rubber encoder 1 has been shown and described as provided with the core metal 3, the use of the core metal 3 is not always essential and can therefore be dispensed with. By way of example, the magnetic member 2 may be formed directly on a to-be-detected rotating member such as an inner race or an outer race of a bearing assembly.

Accordingly, such changes and modifications are, unless they depart from the scope of the present invention as delivered from the claims annexed hereto, to be contrued as included therein.

What is claimed is:

1. A magnetic rubber encoder, which comprises:
   an annular magnetic member made of a rubber material containing a magnet material and having a plurality of opposite magnetic poles alternating with each other in a direction circumferentially of the annular magnetic member, and
   wherein said opposite magnetic poles are provided at intervals of a polarization pitch p, indicative of the pitch between the neighboring magnetic poles, and said magnetic member has a thickness w, said polarization pitch p and said thickness w satisfying the relationship of $0.4\ p \leq w \leq 1.0\ p$.

2. The magnetic rubber encoder as claimed in claim 1, wherein the polarization pitch p is within the range of 0.5 to 1.5 mm.

3. The magnetic rubber encoder as claimed in claim 1, wherein the magnet material is an anisotropic ferrite material.

4. The magnetic rubber encoder as claimed in claim 1, wherein the thickness is measured in a direction in which magnetic fluxes are detected.

5. The magnetic rubber encoder as claimed in claim 1, wherein if the magnetic member is a radial type, the polarization pitch p equals a circumference of the magnetic member divided by a total number of the poles.

* * * * *